US011942760B2

(12) United States Patent
Voss et al.

(10) Patent No.: US 11,942,760 B2
(45) Date of Patent: Mar. 26, 2024

(54) HIGH-POWER ELECTRICALLY TUNABLE SWITCH

(71) Applicant: LAWRENCE LIVERMORE NATIONAL SECURITY, LLC, Livermore, CA (US)

(72) Inventors: Lars F. Voss, Livermore, CA (US); Adam M. Conway, Livermore, CA (US); John E. Heebner, Livermore, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 453 days.

(21) Appl. No.: 17/271,428

(22) PCT Filed: Dec. 19, 2018

(86) PCT No.: PCT/US2018/066589

§ 371 (c)(1),
(2) Date: Feb. 25, 2021

(87) PCT Pub. No.: WO2020/131054

PCT Pub. Date: Jun. 25, 2020

(65) Prior Publication Data

US 2021/0336131 A1 Oct. 28, 2021

(51) Int. Cl.
*H01S 5/042* (2006.01)
*H10N 70/00* (2023.01)

(52) U.S. Cl.
CPC .......... *H01S 5/0428* (2013.01); *H10N 70/00* (2023.02)

(58) Field of Classification Search
None
See application file for complete search history.

(56) References Cited

U.S. PATENT DOCUMENTS 3,917,943 A 11/1975 Auston
4,376,285 A 3/1983 Leonberger et al.
(Continued)

FOREIGN PATENT DOCUMENTS

JP 2017049389 A 3/2017

OTHER PUBLICATIONS

International Search Report and Written Opinion dated Sep. 16, 2019 for International Application No. PCT/US18/66589, 10 pages.

*Primary Examiner* — Nduka E Ojeh
(74) *Attorney, Agent, or Firm* — Perkins Coie LLP

(57) ABSTRACT

A high-voltage switch, whose operation leverages the speed of electrons to generate the "on" time of the pulse in combination with the speed of light to generate the "off" time of the pulse, is described. In one example, the high-voltage switch includes a first electrode, a second electrode spaced apart from the first electrode, a region of non-absorbing material occupying a portion of the space between the first and second electrodes and allowing a laser pulse to propagate therethrough without substantial absorption, and a region of absorbing material occupying another portion of the space and producing a charged particle cloud upon receiving the laser pulse. The high-voltage switch remains "on" upon the charged particle cloud reaching an electrode and until it has been collected by the electrode, and where the high-voltage switch remains "off" subsequent to the collection and until another generated charged particle cloud reaches the electrode.

20 Claims, 13 Drawing Sheets

$t = t_0$ $t = t_1$ $t = t_2$ $t = t_3$

110 +V 130 150 107 120 -V
+V 160 -V
+V 160 -V
+V 160 100 -V

(56) References Cited

U.S. PATENT DOCUMENTS

| | | | | |
|---|---|---|---|---|
| 4,490,709 | A | 12/1984 | Hammond et al. | |
| 4,695,733 | A | 9/1987 | Pesavento | |
| 4,727,349 | A | 2/1988 | Macdonald et al. | |
| 4,899,204 | A | 2/1990 | Rosen et al. | |
| 4,918,508 | A | 4/1990 | Mcintyre et al. | |
| 5,332,918 | A | 7/1994 | Smith et al. | |
| 8,258,632 | B1 * | 9/2012 | Sullivan | H05H 7/02 257/82 |
| 2005/0179680 | A1 | 8/2005 | Makino | |
| 2007/0092812 | A1 | 4/2007 | Caporaso et al. | |
| 2012/0148252 | A1 * | 6/2012 | Turchinovich | G02F 1/01708 398/116 |
| 2014/0263945 | A1 | 9/2014 | Huang et al. | |
| 2021/0336131 | A1 | 10/2021 | Voss et al. | |
| 2022/0123211 | A1 * | 4/2022 | Voss | H03K 17/78 |

* cited by examiner 1050
1010
1040
1030
1041
1020
FIG. 10A
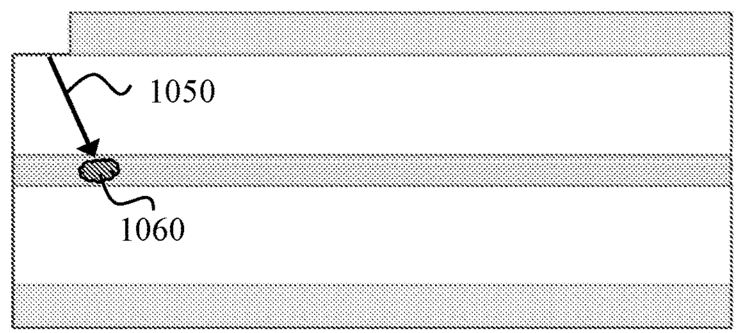
FIG. 10B
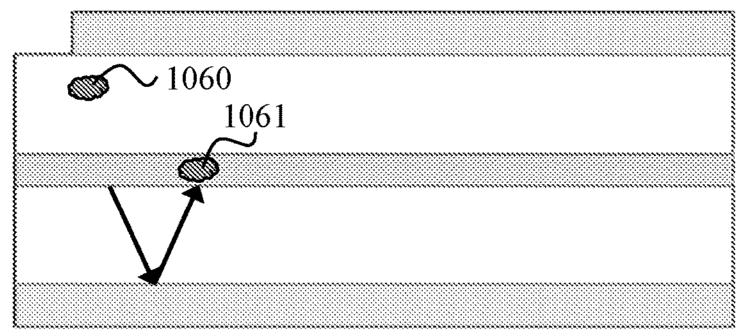
FIG. 10C

HIGH-POWER ELECTRICALLY TUNABLE SWITCH

STATEMENT REGARDING FEDERALLY SPONSORED RESEARCH

The United States government has rights in this invention pursuant to Contract No. DE-AC52-07NA27344 between the U.S. Department of Energy and Lawrence Livermore National Security, LLC, for the operation of Lawrence Livermore National Laboratory.

CROSS-REFERENCE TO RELATED APPLICATION(S)

The present application is a National Phase of International Patent Application No. PCT/US18/66589, titled "HIGH-POWER ELECTRICALLY TUNABLE SWITCH", filed Dec. 19, 2018, the disclosure of which is hereby incorporated by reference in its entirety.

TECHNICAL FIELD

This document relates to high-voltage switches capable of operating over wide frequency ranges.

BACKGROUND

Power semiconductors switching devices are integral to modern power electronics converters. The emergence of wide bandgap (WBG) semiconductor devices promises to revolutionize next-generation power electronics converters. WBG devices feature many characteristics, including high breakdown electrical fields and fast switching speeds, which are beneficial for the efficiency, power density and reliability of power electronics converters.

SUMMARY

In one exemplary aspect, a high-voltage switch is disclosed. This high-voltage switch includes: a first electrode configured to receive a voltage having a first polarity, a second electrode that is spaced apart from the first electrode and configured to receive a voltage paving a second polarity or to be connected to a ground level, a first region of non-absorbing material that occupies at least a portion of a space between the first and second electrodes, the non-absorbing material allowing a laser pulse to propagate therethrough without substantial absorption of the laser pulse, and a first region of absorbing material occupying at least another portion of the space between the first and the second electrodes, the first region of absorbing material configured to produce a charged particle cloud upon receiving the laser pulse, where the high-voltage switch is configured to generate an output current upon the charged particle cloud reaching either the first or the second electrodes and until the charged particle cloud has been collected by the first or the second electrodes, and where the high-voltage switch is configured to generate substantially no output current subsequent to the collection of the charged particle cloud by the first or the second electrodes and until another generated charged particle cloud reaches either the first or the second electrodes.

In another exemplary aspect, a high-voltage switch is disclosed. This high-voltage switch includes: a first electrode comprising a plurality, of conductor regions that are spaced apart and configured to receive a voltage having a first polarity, wherein the first electrode is positioned at a top section of the high-voltage switch, a second electrode that is spaced apart from the first electrode and configured to receive a voltage having a second polarity or to be connected to a ground level, a plurality of laser gain mediums that occupies at least a portion of a space between the first and second electrodes, wherein the plurality of laser gain mediums are positioned to align with spaces between the plurality of conductor regions, wherein at least one of the plurality of laser gain mediums is configured to generate a laser pulse, and a region of absorbing material occupying at least another portion of the space between the first and the second electrodes, the first region of absorbing material configured to produce a charged particle cloud upon receiving the laser pulse, wherein the region of absorbing material is positioned below the plurality of conductor regions, where the second electrode is positioned below the region of absorbing material, where the high-voltage switch is configured to generate an output current upon the charged particle cloud reaching either the first or the second electrodes and until the charged particle cloud has been collected by the first or the second electrodes, and where the high-voltage switch is configured to generate substantially no output current subsequent to the collection of the charged particle cloud by the first or the second electrodes and until another generated charged particle cloud reaches either the first or the second electrodes.

The above and other aspects and their implementations are described in greater detail in the drawings, the descriptions, and the claims.

BRIEF DESCRIPTION OF THE DRAWINGS

FIGS. 10A-10C illustrate an exemplary operation of a high-voltage switch.

DETAILED DESCRIPTION

Solid state devices for generation of high frequency signals are typically implemented through the use of short gate length transistors. A gate controls the conductivity of the base region; in a normally off device, a voltage is applied to turn the device on. This voltage can be modulated at high frequency, but the ultimate limit is governed by the transit time through the channel (which in turn is governed by the length and velocity of carriers). Operating at higher frequencies requires higher mobility semiconductors and/or shortening this distance. The latter inevitably results in low voltage devices, limiting the power output. An alternative approach to high frequency generation uses photoexcitation to excite electrons and/or holes, which modulate the conductivity. This is typically done by band-to-band excitation, requiring photon energy equal or greater than the band gap, or by exciting deep levels with below band gap light. In both cases, the maximum frequency of operation is governed by the lifetime of the carriers. This approach has been used to generate microwaves using SiC:V (vanadium-doped silicon carbide) or mmW and THz using Low Temperature-GaAs (gallium arsenide). In the former, high powers can be achieved but with a maximum possible frequency of ~5 GHz. The latter is not well suited to producing a controlled signal and is not efficient for lower frequency operation.

The disclosed technology overcomes these drawbacks and provides additional features and benefits, which allow the use of the disclosed high-voltage switches in many applications including, but not limited to, communication systems (e.g., millimeter wave communication) and the generation of high-power electromagnetic (EM) waves (e.g., radar). The present document uses section headings and sub-headings for facilitating the understanding of the disclosed embodiments, and not for limiting the scope of the disclosed techniques and embodiments to certain sections. Accordingly, embodiments and configurations disclosed in different sections can be used with each other.

Overview and Exemplary Operation

Figure 1:
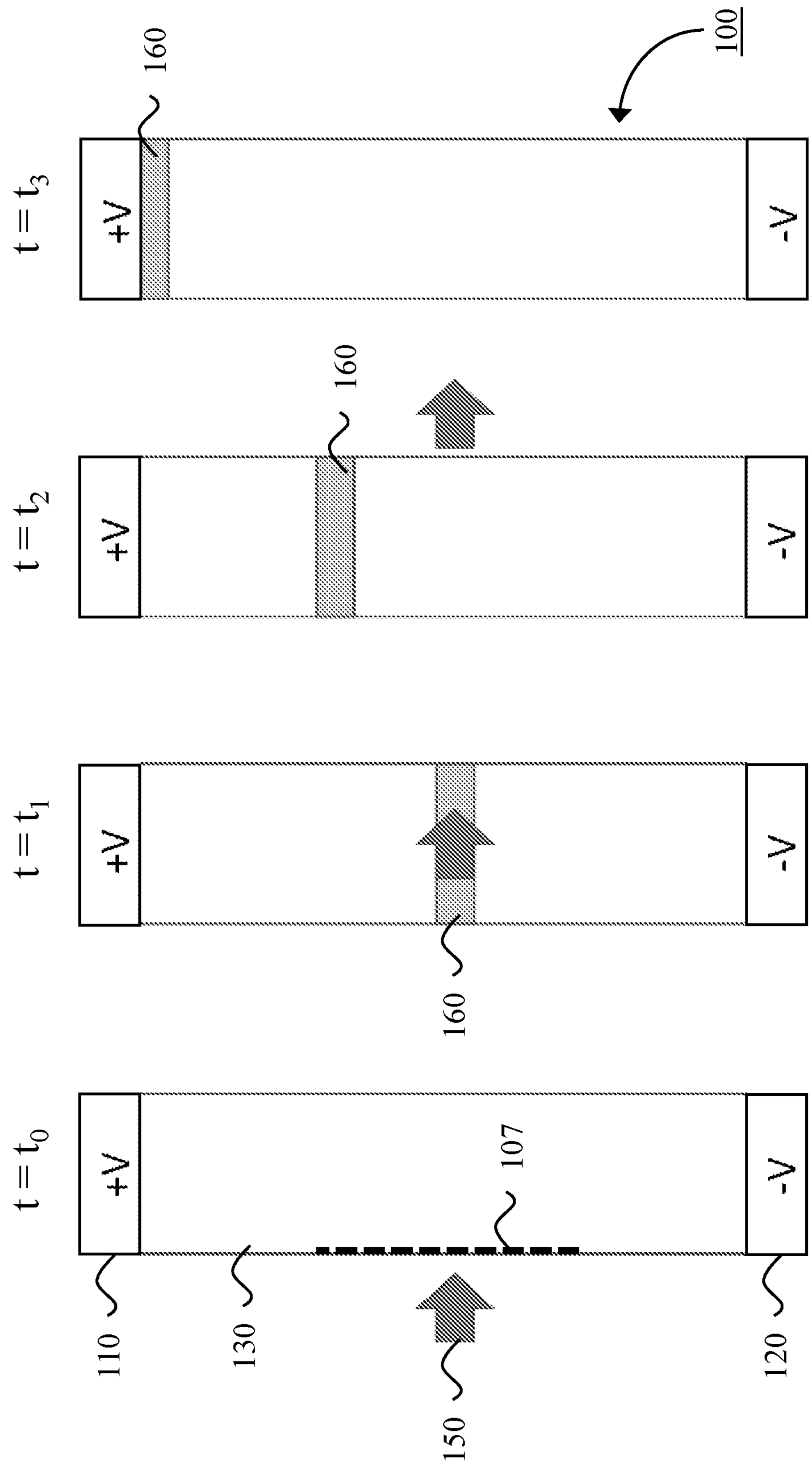
FIG. 1 illustrates an exemplary operation of a high-voltage switch, in accordance with some embodiments of the present disclosed technology.

The exemplary operation of a high-voltage switch, in accordance with some embodiments of the present disclosed technology, is illustrated in FIG. 1. The high-voltage switch 100 is a semiconductor (or solid-state) based switch that can controllably operate (e.g., generate a pulse) in the sub-terahertz (e.g., 10-300 GHz) and single terahertz (e.g., 300 GHz to 3 THz) ranges. The high-voltage switch of FIG. 1 includes a first (e.g., positive) electrode 110 and a second (e.g., negative) electrode 120 at two ends of an absorbing region 130. In some embodiments, the absorbing region is a semiconductor (e.g., doped SiC), and the electrodes are made of a metal or metallic alloy (e.g., a graphite mixture). In some embodiments, one of the electrodes may be a ground electrode (e.g., the second electrode may be at ground level).

At $t=t_0$, an input light beam 150 (e.g., a laser pulse) is incident on the absorbing region 130 of the high-voltage switch 100.

At $t=t_1$, the laser pulse has entered the absorbing region 130 and created a charge carrier cloud 160 (e.g., an electron cloud) in the region of the absorbing region that the input light beam entered. In some embodiments, the charge carrier is an electron cloud, while in other embodiments, it may be primarily comprised of holes. For example, the absorbing region may be doped SiC, and the charge carrier cloud 160 may be 2 micron ($2\times10^{-6}$ m) tall. While the charge carrier cloud 160 is illustrated as a rectangle for illustration purposes, the charge carrier cloud 160 can have different shapes, as will be described later in this document.

At $t=t_2$, and as illustrated in FIG. 1, the electron cloud 160 drifts toward the positive electrode 110 at high-speed. For example, the 2-micron tall electron cloud may travel at a saturation velocity (e.g., the maximum velocity a charge carrier in a semiconductor attains in the presence of very high electric fields) of $2.2\times10^7$ cm/sec.

At $t=t_3$, the electron cloud 160 reaches the positive electrode 110, and begins to be collected by the first electrode 110. This begins the "on" time of the pulse that is created by the high-voltage switch. The "on" time ends (which also defines the "off" time of the pulse beginning), when the charge carrier cloud has been collected by the electrode. For example, the 2-micron tall electron cloud generated in SIC, and travelling at a saturation velocity of $2.2\times10^7$ cm/s, can be collected in 9 picoseconds, which corresponds to an operating frequency of around 60 GHz for a 50% duty cycle.

After creation of the charge carrier cloud 160, the light beam 150 passes out of the absorbing region (as illustrated in FIG. 1 at $t=t_2$), and can be reflected back into the same semiconductor to generate the next pulse (not shown in FIG. 1). For example, the laser beam can travel through another medium before being reflected back into the same semiconductor. The distance before re-entering the semiconductor is determined by the speed of light and governs the "off" time of the switch. In the example discussed in the context of FIG. 1, approximately 4 mm in air generates the required 50% off time.

Similarly, an operating frequency of 600 GHz may be achieved by using a charge carrier cloud with height 200 nanometers (nm), and over a 1 THz operating frequency can be achieved with 100 nm tall charge carrier cloud.

The charge carrier cloud, as illustrated in FIG. 1, has a rectangular profile, which may be implemented using, for example, a mask to block some parts of the laser beam as it enters the absorbing material, or using the characteristics of the absorbing material, or both. In some embodiments, the charge carrier cloud has a Gaussian shape as it travels towards one of the electrodes.

The exemplary operation described above advantageously relies on the speed of electrons (or, generally, the charged particles) to generate the "on" time of the pulse, and the speed of light to generate the "off" time of the pulse. In particular, a pulse of single polarity carriers (e.g., only electrons) with small size can be generated by a subband gap laser that excites deep levels (e.g., V in SiC, Fe or C in GaN (gallium nitride)), such that the entire pulse can be collected in the "on time" determined by the desired frequency of operation. In some embodiments, the output pulse can be made very short by designing the charge carrier cloud to be small and very high-speed.

Exemplary "Single Pulse Vertical" Configurations

Figure 2:
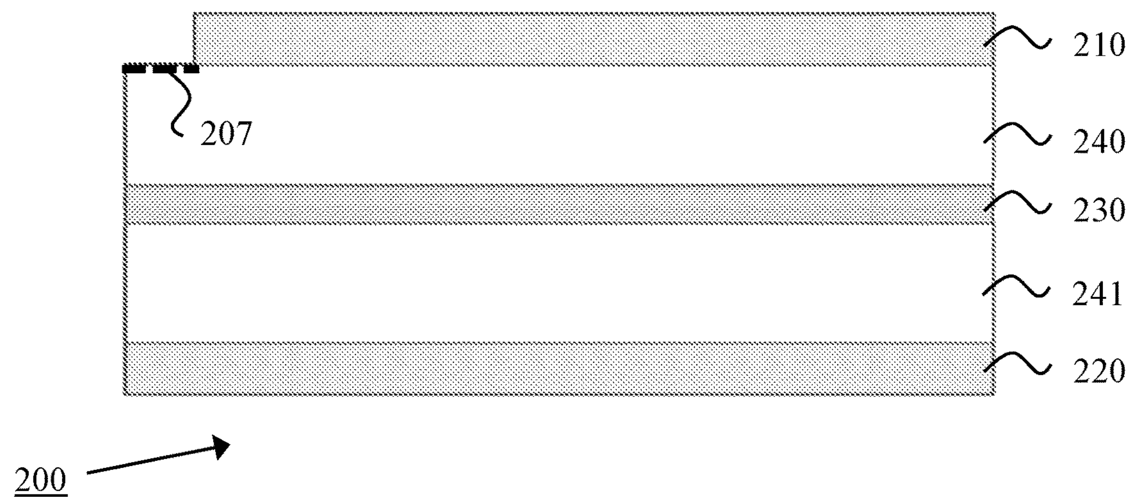
FIG. 2 illustrates an example configuration of a high-voltage switch.
Figure 3:
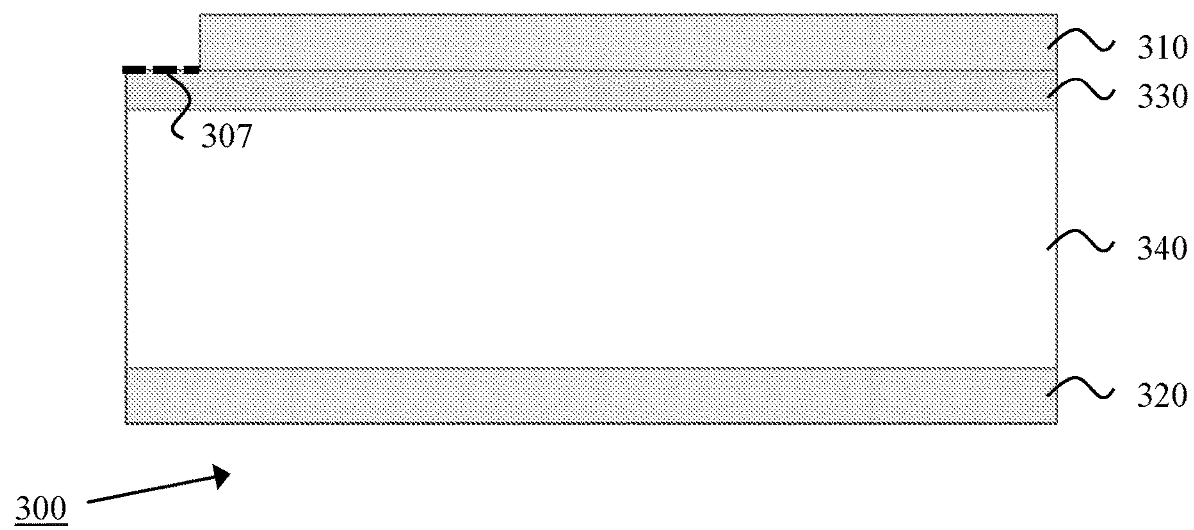
FIG. 3 illustrates another example configuration of the high-voltage switch.
Figure 4:
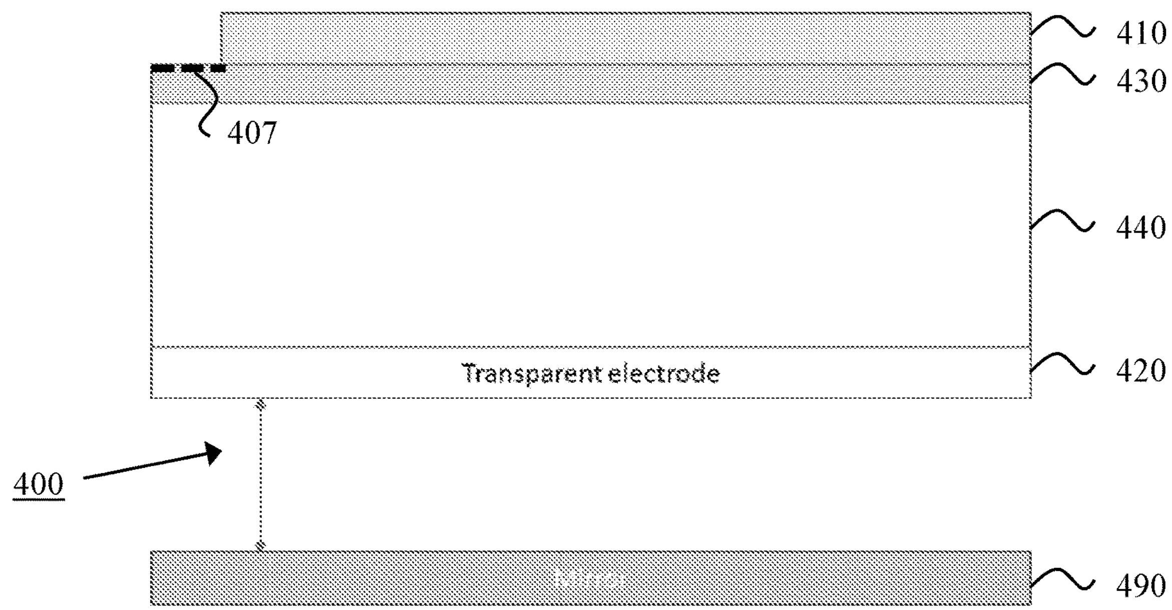
FIG. 4 illustrates yet another example configuration of the high-voltage switch.

FIGS. 2, 3 and 4 illustrate different example configurations of a high-voltage switch that are configured to receive the incident light beam from a top section of the switch. The examples illustrated in FIGS. 2-4 include some features and/or components that are similar to those illustrated in FIG. 1 and each other. At least some of these features and/or components may not be separately described in the context of each of these embodiments.

FIG. 2 illustrates an example configuration of a high-voltage switch 200. As illustrated in FIG. 2, a first electrode 210 is located on top of a non-absorbing layer 240, below which is an absorbing layer 230. In an example, the window 207 that allows in the Incident light to enter the high-voltage switch 200 is positioned at the top of the high-voltage switch 200 and adjacent to the non-absorbing layer 240 (as will be described in the context of FIGS. 10A-10C). Below the absorbing layer 230 is another non-absorbing layer 241, below which is the second electrode 220. In other words, the absorbing layer 230 is sandwiched between two non-absorbing layers (240, 241), above and below which are the first and second electrodes (210, 220), respectively. In some embodiments, the material of the absorbing layer includes a material such as V-doped SiC, which absorbs sub-band gap light, and the material of the non-absorbing layer includes compensated SIC. In other cases, the non-absorbing layer (or region) comprises a material that has a bandgap that is higher than the bandgap of the material that is used in the absorbing layer (or region). In some embodiments, the electrodes 210 and 220 may be highly reflective such that the light reflects multiple times, creating a series of electronic pulses from a single laser pulse. The thickness of the regions 240 and 241 is chosen to determine the "off" time of the switch, while the thickness of 230 is chosen to determine the size of the charge carrier pulse and thus the "on" time.

FIG. 3 illustrates another example configuration of a high-voltage switch 300. As illustrated therein, the high-voltage switch configuration is different from that illustrated in FIG. 2 in that the absorbing layer 330 is below the first electrode 310. In this example, the window 307 that allows in the incident light to enter the high-voltage switch 300 is also positioned at the top of the high-voltage switch 300, albeit adjacent to the absorbing layer 330. Below the absorbing layer 330 is a non-absorbing layer 340, which is on top of the second electrode 320. There is no second non-absorbing layer in the configuration illustrated in FIG. 3. Compared to the configuration of FIG. 2, in the configuration of FIG. 3 the incident light beam enters the absorbing region first before traveling through a longer non-absorbing region, which enables the generation of short duration pulses. In some embodiments, the electrodes 310 and 320 may be highly reflective such that the light reflects multiple times, creating a series of electronic pulses from a single laser pulse. The thickness of the non-absorbing layer 340 is chosen to determine the "off" time of the switch, while the thickness of absorbing layer 330 is chosen to determine the size of the charge carrier pulse and thus the "on" time.

FIG. 4 illustrates yet another example configuration of a high-voltage switch 400. This configuration is similar to that illustrated in FIG. 3, but the second electrode 420 is transparent or substantially transparent, and a mirror 490 is placed at some distance below the second electrode. In some embodiments, the second electrode may be a substantially transparent electrode 420 that allows the input light beam to pass through it, and reflect off the mirror 490 before entering the switch again, thereby advantageously enabling the "off" time of the pulse to be tuned based on the distance between the second electrode 420 and the mirror 490.

In the configurations illustrated in FIGS. 2-4, the size of the charge carrier cloud may be controlled, for example, by the thickness of the absorbing layer. In some configurations, the thickness and material configuration of the absorbing layer may also be used to define the shape of the charge carrier cloud. For example, a thin (e.g., 10-nm thick) absorbing layer that is illuminated from the top can produce a short duration pulse. In such a configuration, higher power lasers can be used to generate the small-size charge cloud, and the size of such a charge cloud is not limited by the diffraction limit of the optical components or the spot size of the laser.

Exemplary "Single Pulse Lateral" Configurations

Figure 5:
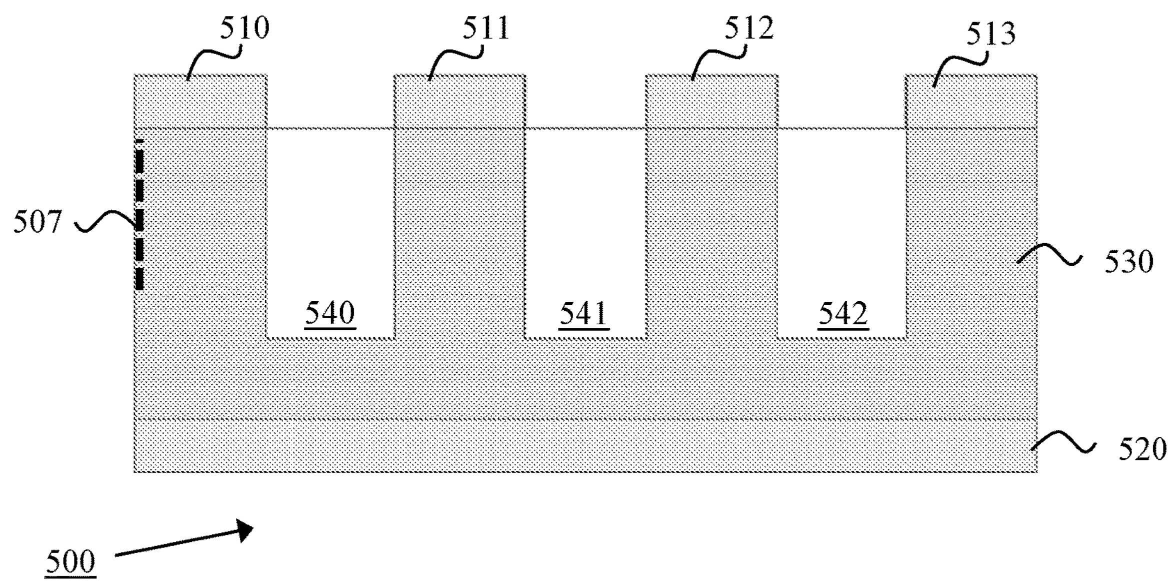
FIG. 5 illustrates yet another example configuration of the high-voltage switch.

FIG. 5 illustrates yet another example configuration of a high-voltage switch 500 that can operate using a single pulse with a source that illuminates the switch laterally from the side of the switch, e.g., the incident light beam is a single laser pulse that is incident upon the switch from a substantially lateral direction. This example includes some features and/or components that are similar to those illustrated in FIGS. 1-4. At least some of these features and/or components may not be separately described in the context of each of these configurations.

As illustrated in FIG. 5, the first electrode is configured as multiple flat conductor strips (510, 511, 512, 513) that are spaced apart from each other. The space between the strips of the first electrode and the second electrode 520 includes an absorbing region 530, and multiple non-absorbing regions (540, 541, 542) that are located in between the strips of the first electrode. In some embodiments, for the configuration illustrated in FIG. 5, the size of the electron cloud may be controlled by the spot size of the input laser pulse. In an example, the window 507 that allows in the incident light to enter the high-voltage switch 500 is positioned at the side of the switch, adjacent to the absorbing layer 230 (as will be described in the context of FIGS. 11A-11C).

In some embodiments, the non-absorbing regions (540, 541, 542) may include a material having a bandgap that is higher than the bandgap of the material that is used in the absorbing region 530. In other embodiments, the non-absorbing regions may be eliminated; for example, there may be air gaps where the non-absorbing region is illustrated in FIG. 5.

Exemplary "Multi-Pulse Axial" Configurations

Figure 6:
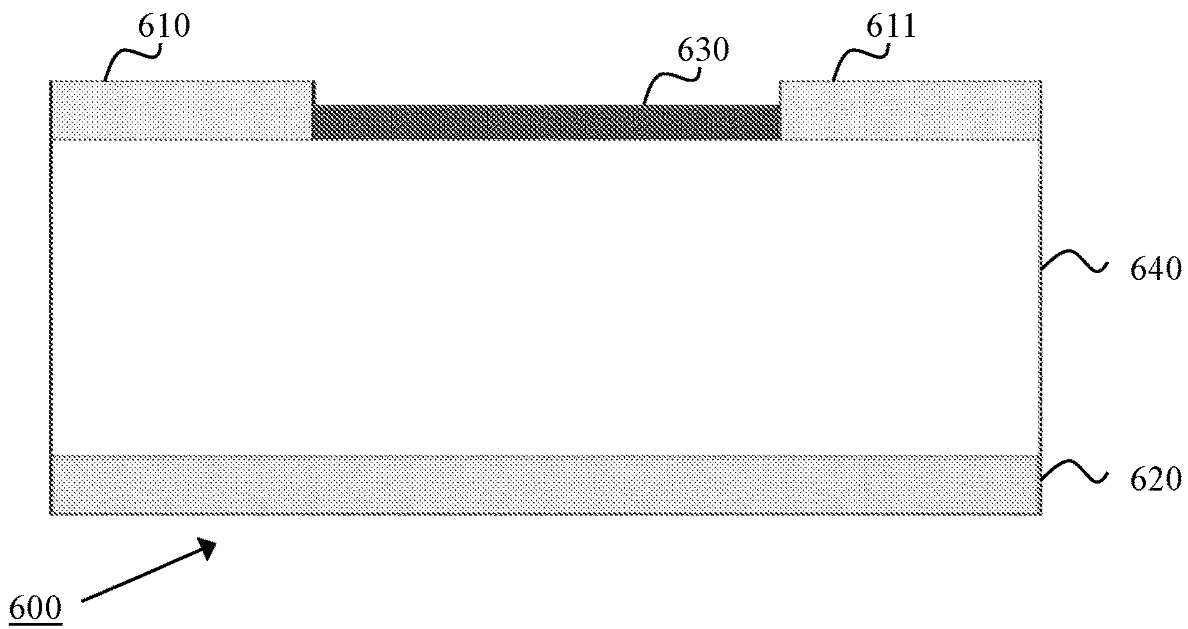
FIG. 6 illustrates yet another example configuration of the high-voltage switch.
Figure 7:
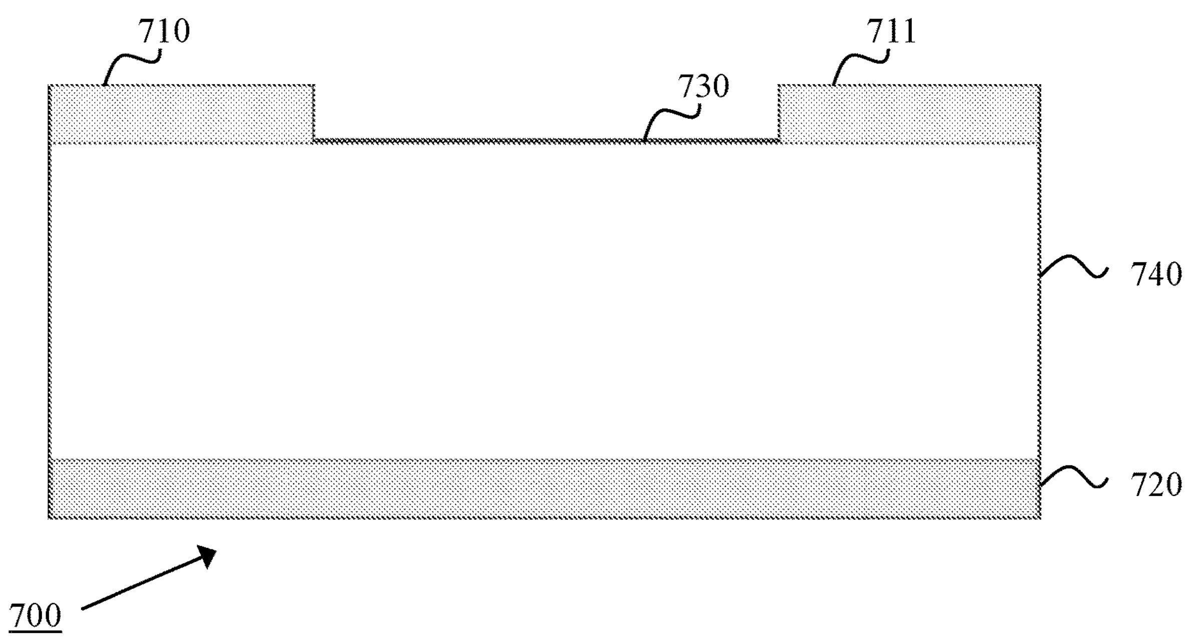
FIG. 7 illustrates yet another example configuration of the high-voltage switch.

FIGS. 6 and 7 illustrate different example embodiments of a high-voltage switches that can operate using multiple pulses, and which have a source that illuminates the switch from above, e.g., the Incident light beam includes multiple laser pulses that are incident upon the switch from a substantially axial direction. The examples illustrated in FIGS. 6 and 7 include some features and/or components that are similar to those illustrated. In FIGS. 1-5 and each other. At least some of these features and/or components may not be separately described in the context of each of these embodiments.

As illustrated in FIG. 6, the first electrode comprises two sections (610, 611) that are spaced apart from each other. The non-absorbing layer 640 is sandwiched between the two sections of the first electrode and the second electrode 620. A layer of absorbing material 630 is configured on top of the layer of non-absorbing material 640 and in between the two sections of the first electrode (610, 611). In contrast with the configurations illustrated in FIGS. 2-5, the absorbing layer in FIG. 6 absorbs more strongly, and can be made extremely thin, thereby advantageously creating a charge carrier cloud that is shorter than in other configurations. This results in the charge carrier cloud being collected more quickly, thereby reducing the duration between the front and the back of the output pulse.

FIG. 7 illustrates a similar configuration as in FIG. 6, but with a thinner layer of absorbing material 730 (as compared to the configuration illustrated in FIG. 6). Furthermore, the configuration illustrated in FIG. 7 employs two photon absorption to create the charge carrier cloud. Since two-photon absorption is a non-linear process and very dependent on the intensity of the incident light, the embodiment illustrated in FIG. 7 is typically used with a picosecond (ps) pulse. Alternately, two intersecting laser pulses may be used which produce an intensity sufficient for two-photon absorption only at the intersection.

The configurations Illustrated in FIGS. 2-5 are characterized by the "off" time of the pulse being dependent on the transit time of the incident light through one or more non-absorbing regions (e.g., air, material with high bandgap than that of the absorbing material, or both). In the configurations illustrated in FIGS. 6 and 7, wherein multiple laser pulses are employed, the "off" time of the pulse is based on the time between the generation of two consecutive laser pulses.

Other Exemplary Configurations

Figure 8:
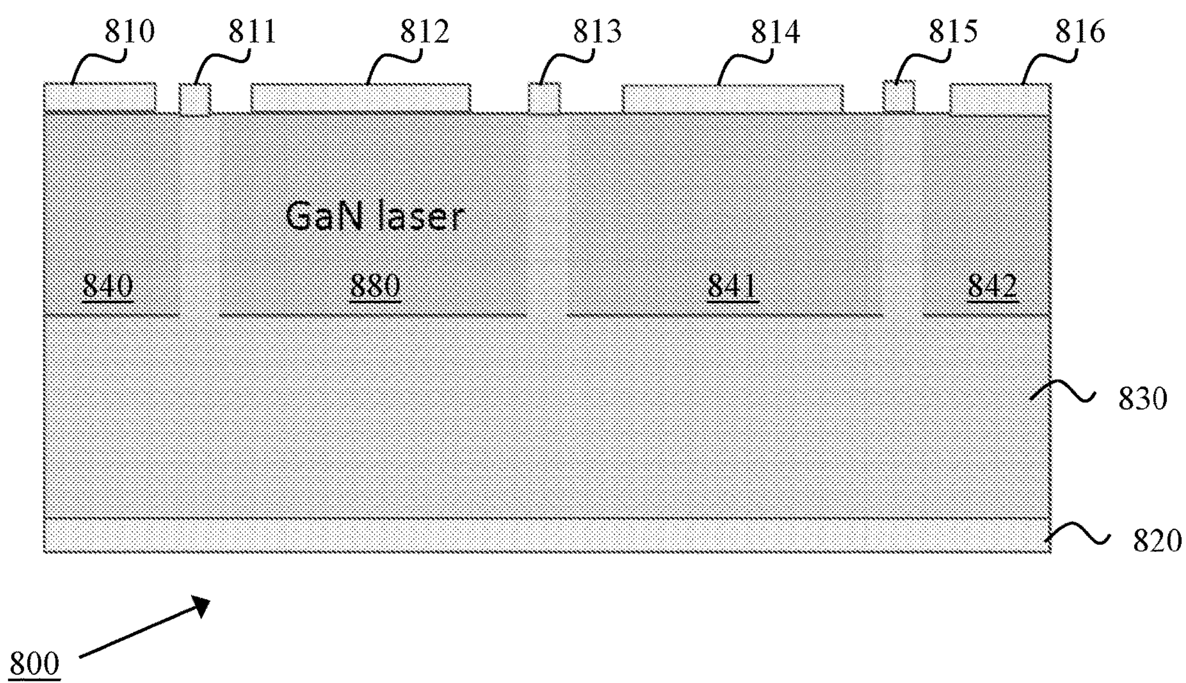
FIG. 8 illustrates yet another example configuration of the high-voltage switch.
Figure 9:
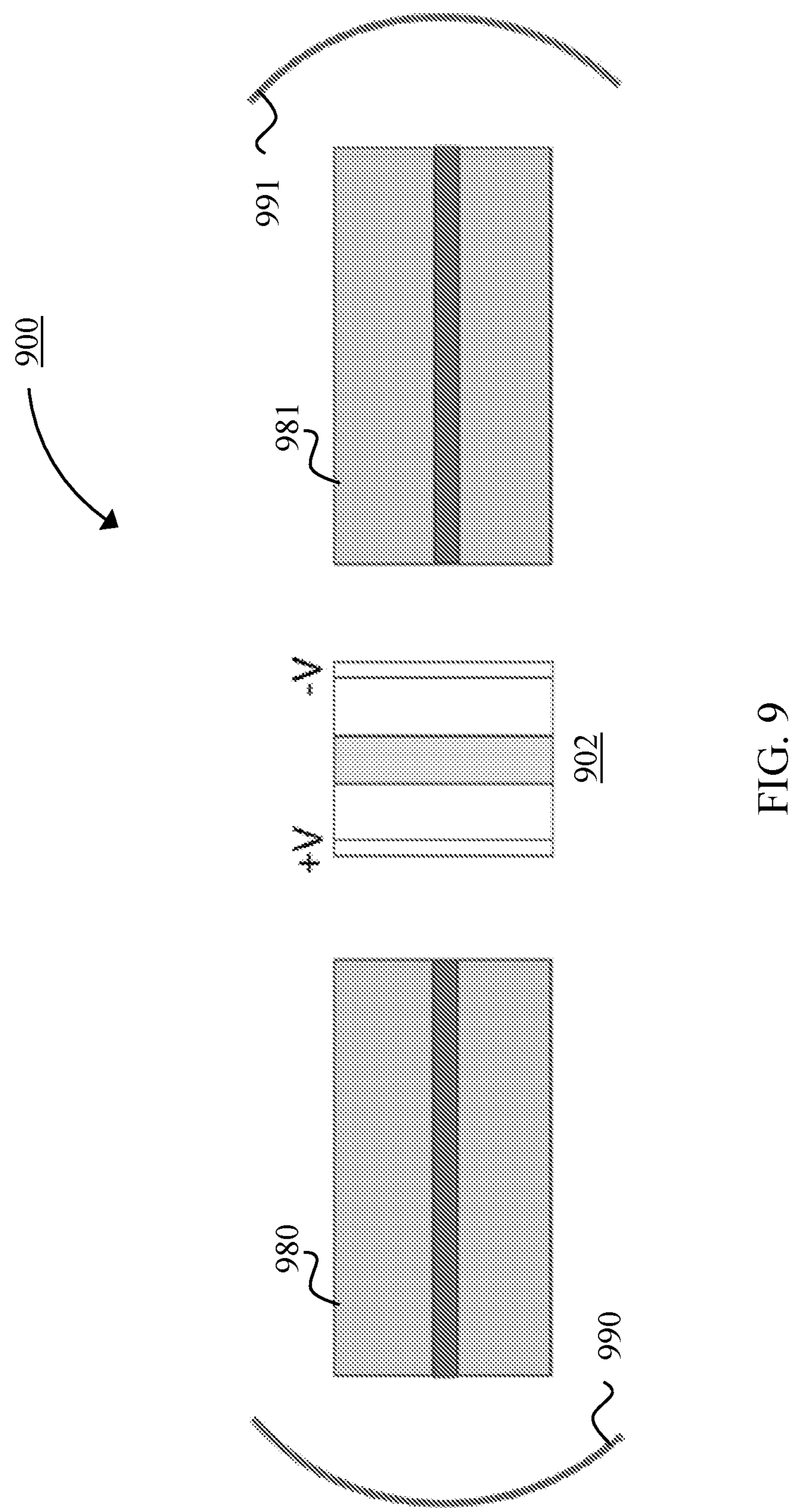
FIG. 9 illustrates a tunable switch including a high-voltage switch, and capable of generating a continuous pulse train.

FIGS. 8 and 9 illustrate additional configurations of the disclosed technology. The configuration illustrated in FIG. 6 resembles the configuration illustrated in FIG. 5, wherein the first electrode comprises multiple strips (810, 811, . . . , 816), the second electrode 820 is spaced apart from the first electrode, and the space between them includes an absorbing region 830 and non-absorbing regions (841, 842, 843) that are located in the spaces between every other strip of the first electrode (e.g., non-absorbing region 841 is in between first electrode strips 813 and 815). However, in contrast to the configuration illustrated in FIG. 5, the configuration illustrated in FIG. 8 replaces one region of the non-absorbing material with a laser source 880. In other words, it is an advantageously integrated version of the one illustrated in FIG. 5 (which uses an external laser source).

In one example, a gallium nitride (GaN) laser source 880 is used with SiC as the absorbing material, which leverages manufacturing capabilities that enable growing GaN on SIC. In another example, an aluminum gallium arsenide (AlGaAs) laser may be used in conjunction with a gallium arsenide (GaAs) switch.

FIG. 9 illustrates a tunable switch 900 that includes a high-voltage switch 902 that Is placed in an optical cavity (or resonator), in accordance with the presently disclosed technology. The configuration illustrated in FIG. 9 advantageously enables a continuous pulse train to be generated, and allows tunability and amplification of the incident beam as it travels through the cavity, thereby enabling additional control and modulation of the switch output. One example application of the tunable switch 900 is in high-frequency communications. In one example, the switch 902 is similar to the configuration illustrated in FIG. 2, but rotated 90° and with transparent (or semi-transparent, or substantially transparent) electrodes. The tunable switch 900 includes two laser gain media (generally identified as 980 and 981) on either side of the switch 902 that provide amplification for the laser beam that propagates through the gain media 980 and 981. Two end mirrors 990, 991 complete the resonator and allow sustained lasing activity. In some embodiments, the two end mirrors 990, 911 may be more generally implemented as reflective surfaces (e.g., a high reflectance coating deposited on a glass, metal or semiconductor substrate).

The configurations illustrated in FIGS. 2-5 can operate using a single pulse that is incident on the switch, which generates multiple charge carrier clouds as it enters and re-enters the absorbing region (s). Under this operating procedure, after a few reflections, the laser pulse will be completely absorbed by the absorbing layer in the switch. This may result in the last few pulses being somewhat degraded as compared to the initial pulses (e.g. slightly different pulse shape). Thus, sustained operation of such switches requires either injection of new laser pulses, or amplification of the Initial laser pulsed as it weakens due to absorption and reflection. The configuration in FIG. 9, among other features and benefits, enables a single laser pulse to be reenergized, or continuously amplified, thereby resulting in a continuous pulse train, wherein subsequent pulses are not degraded compared to the initial pulses.

As illustrated in FIG. 9, a laser pulse that illuminates the switch 902 (e.g., generated by the laser gain medium 980), travels through the switch 902 (therein generating a charge carrier cloud, and losing some energy), and continues to travel through the laser gain medium 981 which amplifies the pulse, which is then reflected back from the mirror 991, travels back through the laser gain medium 981 (and undergoes further amplification), and back into the switch 902 to generate another charge carrier cloud. Thus, the "on" time of the resulting pulse, as in the case of FIG. 5, is based on the thickness of the absorbing layer, and the "off" time of the pulse is based on the transit time of the pulse after it leaves the switch, reflects off the mirror and re-enters the switch. The pulse then travels in the other direction (through gain medium 980 and reflecting off mirror 990, travels through the gain medium 980) and re-enters the switch to generate yet another charge carrier cloud. In this manner, a continuous train of pulses can be created, with the input laser pulse being periodically amplified thereby ensuring the fidelity of the output pulses.

Additionally, the configuration of FIG. 9, provides separate amplification (and thus modulation) control for the light that enters the switch from the left and from the light side. In some embodiments, the optical gain (e.g., through changing the bias levels) at each gain medium 980, 981 can be controlled dynamically to provide the desired amplitude modulation of the optical pulses, which in turn can be used to produce modulated electrical pulses that are output from the switch 902. In some embodiments, one or more controllable optical attenuators can be placed in the optical cavity (e.g., between gain media 980, 981 and the end mirrors 990, 991) to provide an additional, or an alternative modulation mechanism). Moreover, in some embodiments, only one laser gain medium may be used in the optical cavity to provide amplification of the laser light. In some embodiments, the reflectively of the mirrors and the transparency of the electrodes can be adjusted as a further mechanism to achieve the required performance and output characteristics, and to modulate the amplitude of the laser pulses. In other embodiments, the voltage on the switch can be modulated.

In some embodiments, the laser gain medium may be implemented using a semiconductor laser diode, which could be used to generate the initial laser pulse, and then could be electrically pumped to restore the intensity of the laser pulse.

As seen in the context of FIGS. 1-9, embodiments of the disclosed technology describe high-voltage switches that are very tunable and operate across a wide range of frequencies, and their operation is described in FIGS. 10-14.

Exemplary Methods of Operation of the Disclosed Technology

FIGS. 10A-10C illustrate the exemplary operation of the configuration of the high-voltage switch illustrated in FIG. 2. As illustrated in FIG. 10A, the input laser pulse 1050 is incident on the non-absorbing layer 1040 from a substantially vertical orientation. The input laser pulse propagates through the first non-absorbing layer 1040, without substantial absorption, and is incident on the layer of absorbing material 1030. As illustrated in FIG. 10B, a first charge carrier cloud 1060 is created in the absorbing layer 1030. In FIG. 10C, the laser pulse reflects off the second electrode 1020 and back to the layer of absorbing material 1030, wherein it creates a second charge carrier cloud 1061, while the first charge carrier cloud 1060 is propagating to the first electrode 1010. The process continues with the laser pulse alternatingly reflecting off the second and first electrodes, creating new charge carrier clouds in the absorbing layer 1030, and eventually being completely absorbed in the high-voltage switch.

As was discussed in the context of FIG. 1, the "on" time of the pulse (or equivalently, the duration over which the high-voltage switch outputs a substantial amount of current) is based on the time by the first electrode to collect the charge carrier cloud. In other words, the size and speed of the charge carrier cloud determines how quickly it Is collected by the electrode, and thus, the "on" time of the pulse. As illustrated in FIG. 10C, the "off" time of the pulse (or equivalently, the duration over which the high-voltage switch outputs substantially no current) is based on the propagation time of the laser pulse through the layers of non-absorbing material. Specifically, the "off" time is the duration from the end of the collection of the first charge carrier cloud 1060 and the start of the collection of the second charge carrier cloud 1061, Furthermore, the size of the charge carrier cloud can be controlled by the thickness of the absorbing layer 1030.

Figure 11A:
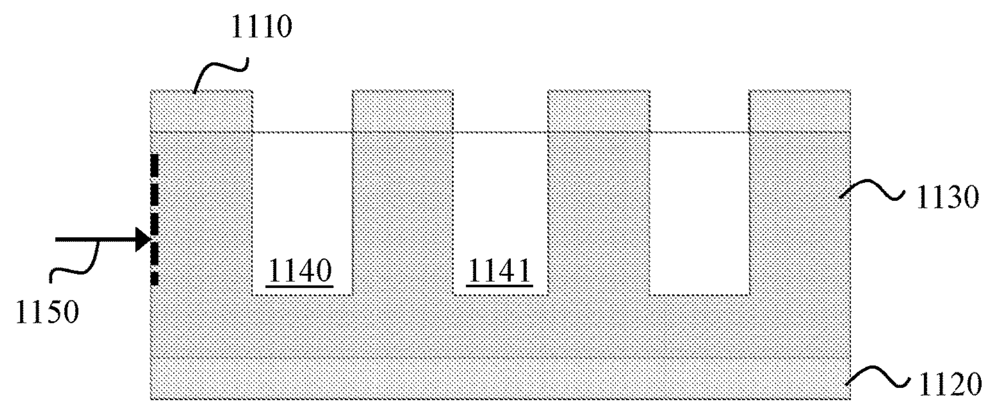
FIGS. 11A-11C illustrate another exemplary operation of a high-voltage switch.
Figure 11B:
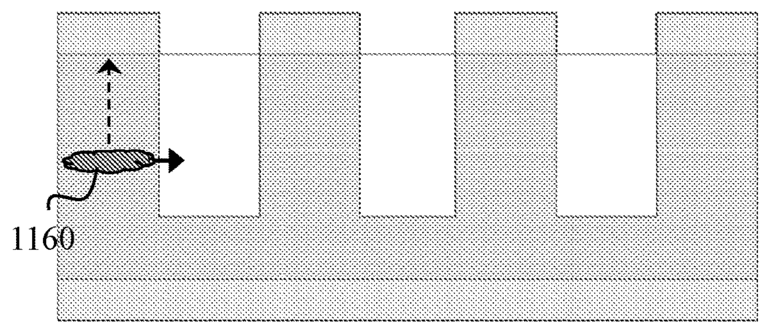
Figure 11C:
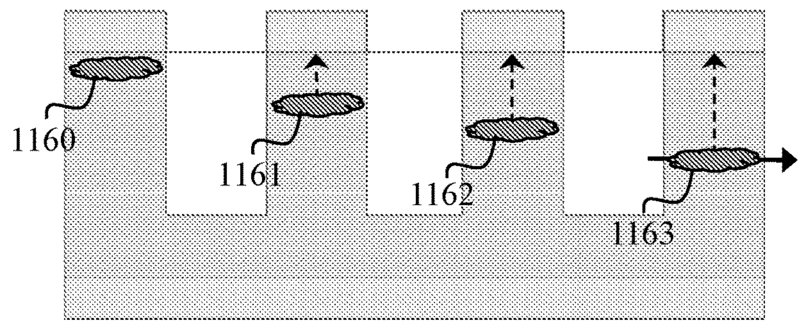

FIGS. 11A-11C illustrate the exemplary operation of an embodiment of the high-voltage switch illustrated in FIG. 5. As illustrated in FIG. 11A, the laser pulse 1150 is incident on a region of absorbing material on a lateral surface of the switch. The laser pulse 1150 creates a charge carrier cloud 1160 in the first portion of the region of absorbing material as it propagates therein. The pulse then propagates through a first region of non-absorbing material 1140, into a second portion of the region of absorbing material (where a second charge carrier cloud 1161 is created), into a second region of non-absorbing material 1141, and so on.

FIG. 11C illustrates the input pulse leaving the switch having formed four charge carrier clouds (1160, 1161, 1162, 1163) in the regions of the absorbing layer that are interspersed with the regions of the non-absorbing layer. The charge carrier clouds move towards the respective flat conductor strips of the first electrode, and are collected to generate a substantial amount of current at the first electrode as they are consecutively collected. The "on" time of the pulse corresponds to the duration of the collection of each of the charge carrier clouds, and the "off" time of the pulse is based on the propagation of the laser pulse through the non-absorbing region, as it moves from one portion of the region of absorbing material to the next.

In some embodiments, the size and velocity of the charge carrier clouds is controlled by the input laser pulse spot size. In some embodiments, the regions of non-absorbing material may be replaced with an air gap, e.g. any material (or lack thereof) that has a bandgap that is higher than the bandgap of the absorbing material. In some embodiments, the operating frequency is based on the speed of light within the switch, and thus, the absorbing and non-absorbing materials may be selected based on the intended application.

In some embodiments, e.g., the configurations with laser reamplification as illustrated in FIGS. 2-5, the high-voltage switch may be designed to enable the incident laser pulse to only generate a single charged particle cloud. In other words, once the input laser has passed through the absorbing region, it may be guided through the non-absorbing material until it eventually gets absorbed or exits the high-voltage switch, thereby creating a single charged particle cloud. If a second pulse needs to be output, another incident laser pulse is used.

Figure 12A:
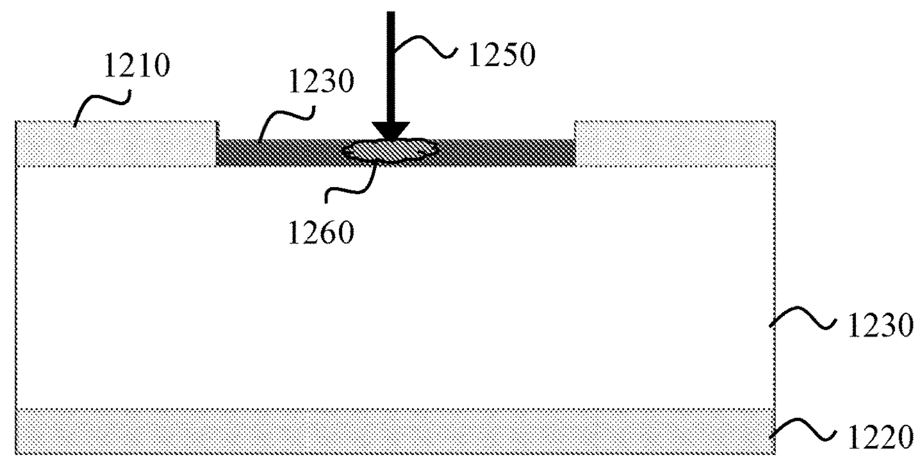
FIGS. 12A-12C-illustrate yet another exemplary operation of a high-voltage switch.
Figure 12B:
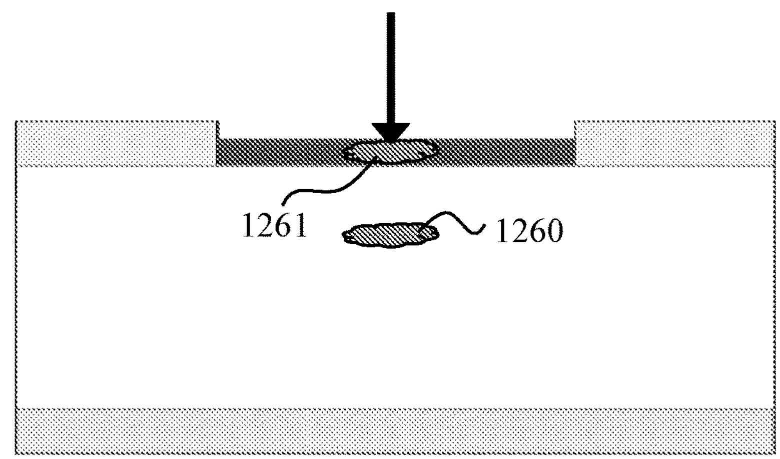
Figure 12C:
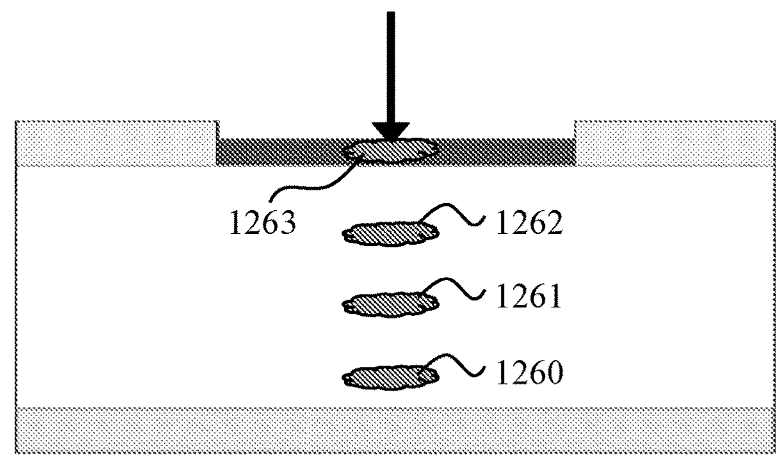

FIGS. 12A-12C illustrate the exemplary operation of the configuration of the high-voltage switch illustrated in FIG. 6. As illustrated in FIG. 12A, the first laser pulse 1250 is incident on the switch in a substantially axial orientation. The laser pulse 1250 strikes the region of absorbing material 1230, which is positioned between the two strips of the first electrode. A first charge carrier cloud 1260 is generated in absorbing layer 1230 as illustrated in FIG. 12A.

In FIG. 12B, a second laser pulse 1251 is incident on the absorbing layer 1230, and creates a second charge carrier cloud 1261. At the same time, the first charge carrier cloud 1260 propagates towards the second electrode 1220 through the layer of non-absorbing material 1240. FIG. 12C illustrates the operation at a later time wherein the first charge carrier cloud 1260 has nearly reached the second electrode, and another charge carrier cloud is being created in the absorbing layer. The "on" time in this embodiment is the duration of the collection of the charge carrier cloud by the second electrode, and the "off" time is the time in between consecutive laser pulses (e.g., the time between the first laser pulse 1250 and the second laser pulse 1251). In some embodiments, the example illustrated in FIGS. 12A-12C may produce pulses with very short "on" times since the charge carrier clouds are generated in a very thin layer of the absorbing material 1230. In some embodiments, the absorption of the incident laser pulses (1250, 1251, . . . ) in the absorbing layer 1230 is a linear process (e.g., there is a linear dependence between the rate of absorption and the intensity of the incident laser pulse).

Figure 13A:
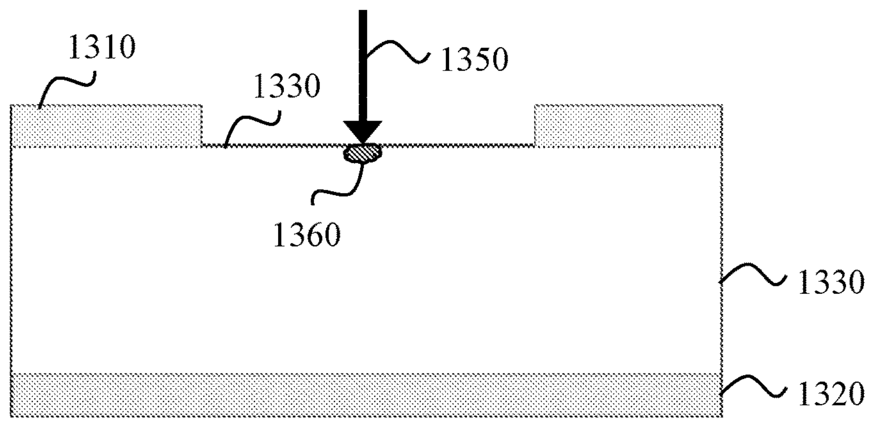
FIGS. 13A-13C illustrate yet another exemplary operation of a high-voltage switch.
Figure 13B:
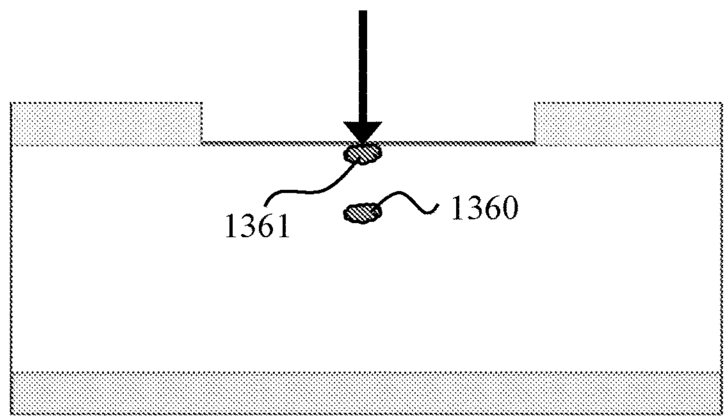
Figure 13C:
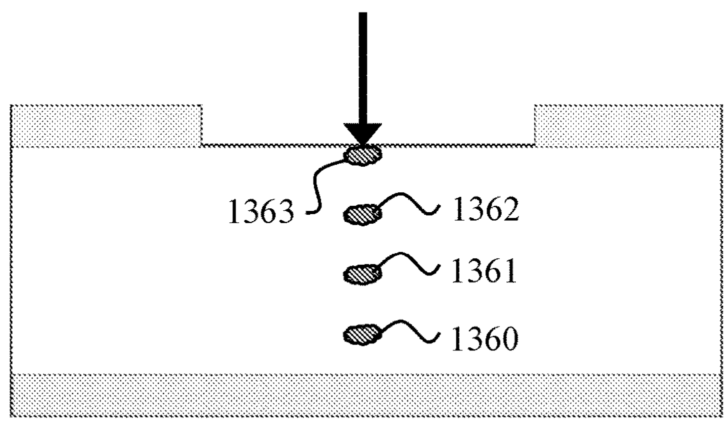

FIGS. 13A-13C illustrate the exemplary operation of the configuration of the high-voltage switch illustrated in FIG. 7. This example includes some features and/or components that are similar to those illustrated in FIGS. 12A-12C. At least some of these features and/or components may not be separately described in the context of each of these embodiments. The operation of the configuration illustrated in FIGS. 13A-13C is similar to that described in the context of FIGS. 12A-12C, with the difference that the layer of absorbing material is thinner and enables two-photon absorption in the absorbing layer 1330.

Two photon absorption (TPA) is the absorption of two photons of identical or different frequencies in order to excite a molecule from one state (usually the ground state) to a higher energy electronic state. The energy difference between the involved lower and upper states of the molecule is equal to the sum of the photon energies of the two photons. Two-photon absorption is a second-order process, several orders of magnitude weaker than linear absorption at low light intensities (which is used in the configuration illustrated in FIGS. 12A-12C). It differs from linear absorption in that the atomic transition rate due to TPA depends on the square of the light intensity, thus it is a nonlinear optical process, and can dominate over linear absorption at high intensities. Thus, the configuration illustrated in FIGS. 13A-13C uses a high intensity pulse with a very short duration (e.g., a high-power picosecond pulse).

Figure 14:
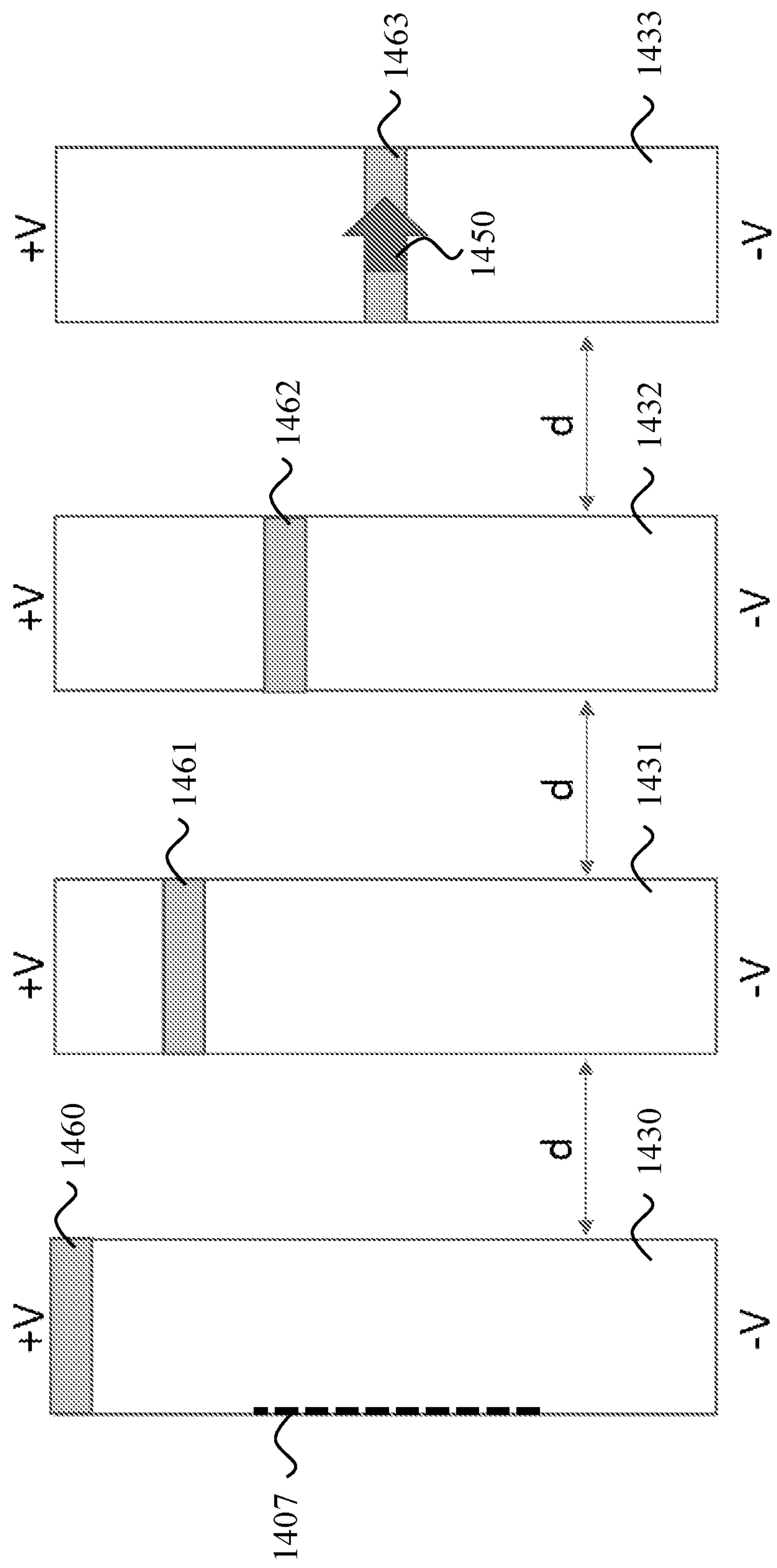
FIG. 14 illustrates yet another exemplary operation of a high-voltage switch.

FIG. 14 illustrates the exemplary operation of the configuration of the high-voltage switch similar to that illustrated in FIG. 1. The high-voltage switch illustrated in FIG. 1, which includes a region of absorbing material sandwiched between first and second electrodes, may be replicated to provide the generation of a pulse train, as illustrated in FIG. 14. Note that FIG. 1 illustrated the evolution of charge carrier cloud in the switch as a function of time, whereas FIG. 14 illustrates a configuration wherein the switch is replicated and spaced apart (with absorbing layers 1430, 1431, 1432, 1433, respectively).

The laser pulse 1450 is illustrated creating a fourth charge carrier cloud 1463 in the absorbing region 1433 of the fourth switch. Its propagation through the absorbing regions of the first three switches (1430, 1431 and 1432) has resulted in the creation of three charge carrier clouds (1460, 1461 and 1462), respectively, and which have been moving towards the first electrode of their respective switch. As each of the charge carrier clouds is collected by the respective first electrode, the switch will generate a substantial amount of current. The switches in series will therefore generate a continuous pulse train, which has important applications in high-frequency communication systems.

Figure 15A:
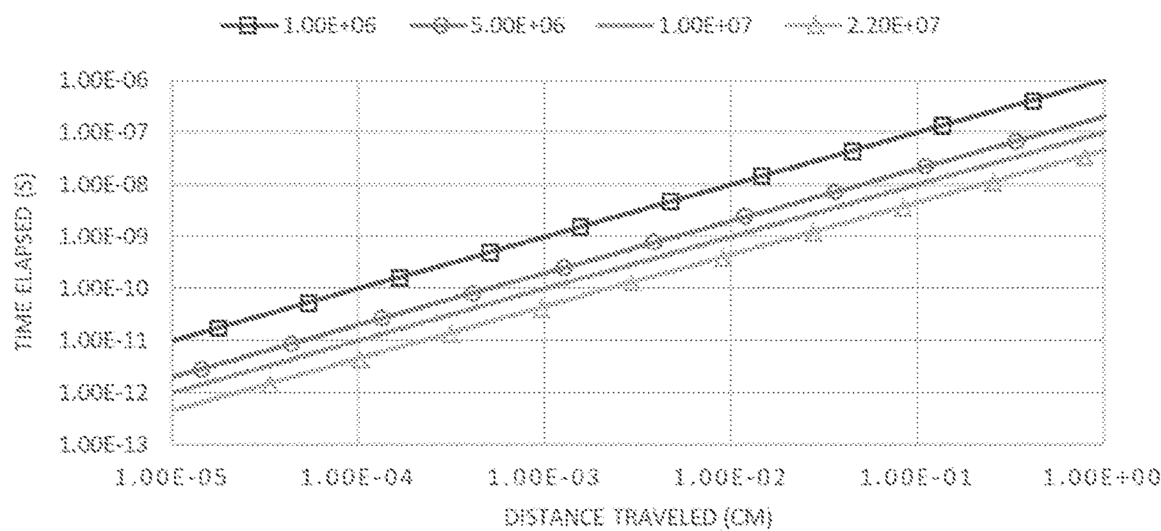
FIGS. 15A-15C illustrate numerical results that span a portion of the trade space used in the design of the high-voltage switches, in accordance with the presently disclosed technology.
Figure 15B:
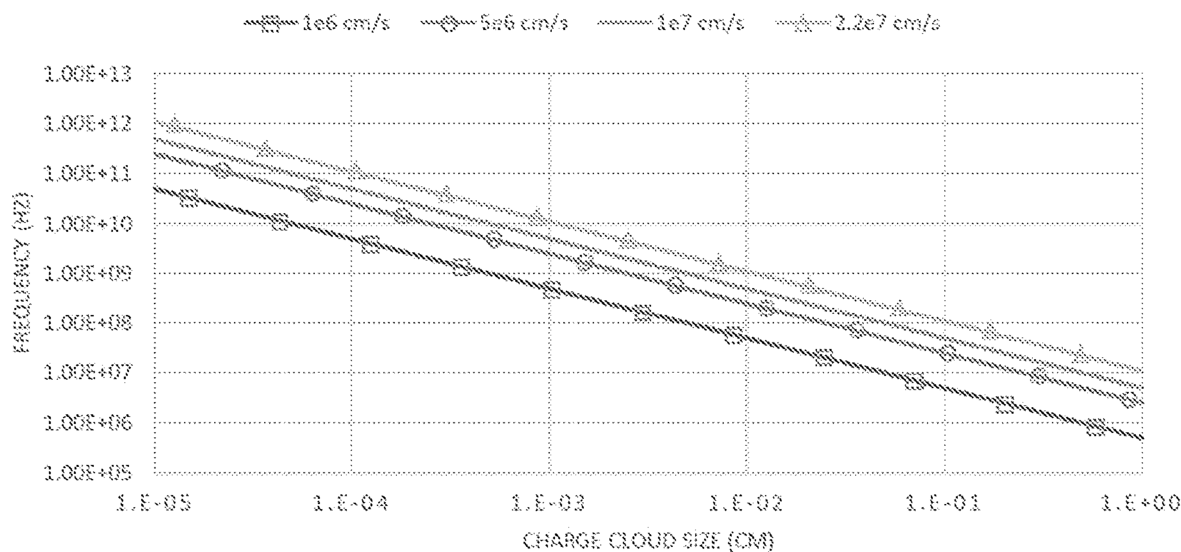
Figure 15C:
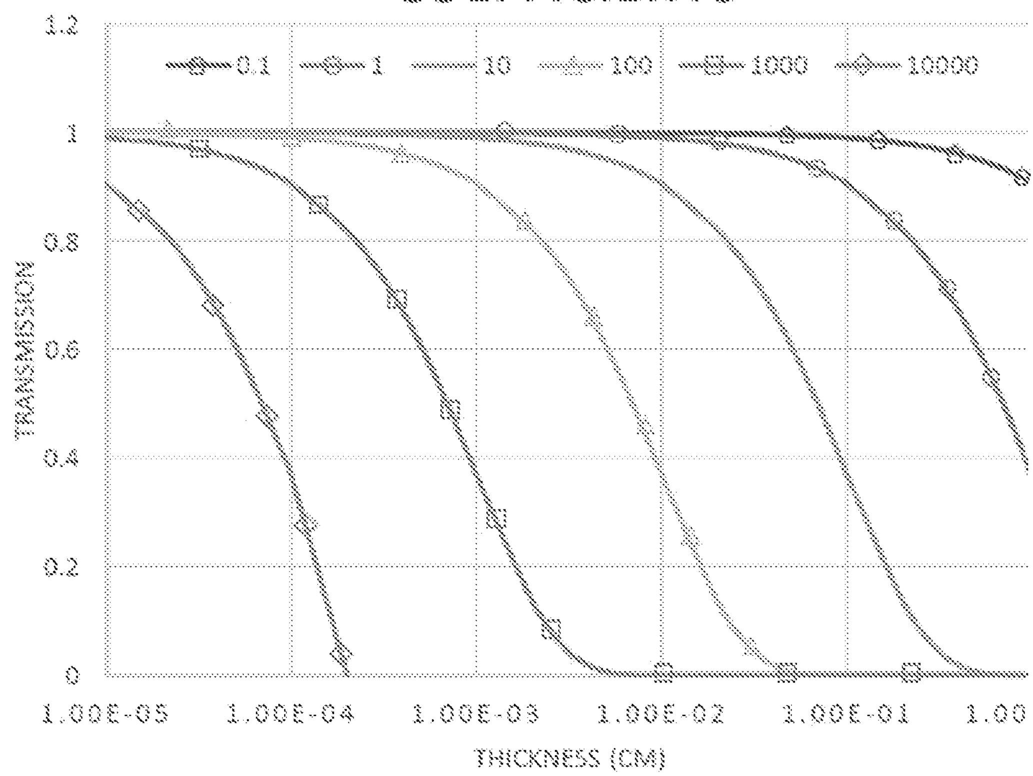

FIGS. 15A-15C Illustrate numerical results that span a portion of the trade space used in the design of the high-voltage switches. FIGS. 15A and 15B Illustrate some of the trade-offs with regard to charge cloud considerations for different velocities. As described above, the operating frequency is based on the time elapsed between the first charge carriers arriving at the electrode until the last charge carriers arrive. For example, at near saturation velocity, the charge carrier cloud must be on the order of 1-3 microns in order to achieve an operating frequency of 20 GHz. In the example of the axial switch embodiments (e.g., FIGS. 6 and 7), this implies the laser pulse should be fully absorbed within 1-3 microns. In the example of the lateral switch embodiments (e.g., FIG. 5), this implies that the laser spot must be less than 3 microns in size, and the flat conductor strips of the first electrode must be sufficiently small such that the time to traverse that length must impact the charge cloud.

FIG. 15C illustrates the transmitted intensity for various absorption coefficients. In the example of the axial switch (e.g., FIGS. 6 and 7), the absorption coefficient must be at least 10,000 cm−1 to minimize the size of the charge carrier cloud. These considerations will factor into selecting the absorbing and non-absorbing materials, and subsequently matching the wavelength of the input laser pulse to the selected materials. Furthermore, and as illustrated in FIG. 7, an intense laser pulse may be used to as to enable two-photon absorption.

Other design considerations include the laser spot size being small enough to enable the highest desired frequency operation given the electron velocity, e.g., $\sim 1\times10^{1}$ cm/s, which typically results in a laser spot size of less than 3 microns, and the non-absorbing material having a similar refractive index as the absorbing material, e.g., vanadium-doped SIC for the absorbing material and undoped SiC for the non-absorbing material.

In some embodiments, the trade-offs include considering, the recombination time of the carriers. Specifically, a long recombination time is preferred to minimize carrier loss.

It is intended that the specification, together with the drawings, be considered exemplary only, where exemplary means an example and, unless otherwise stated, does not imply an ideal or a preferred embodiment. As used herein, the use of "or" is intended to include "and/or", unless the context clearly indicates otherwise.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this disclosure.

What is claimed is:

1. A high-voltage switch, comprising:

a first electrode configured to receive a voltage having a first polarity;

a second electrode that is spaced apart from the first electrode and configured to receive a voltage having a second polarity or to be connected to a ground level;

a first region of non-absorbing material that occupies at least a portion of a space between the first and second electrodes, the non-absorbing material allowing a laser pulse to propagate therethrough without substantial absorption of the laser pulse; and a first region of absorbing material occupying at least another portion of the space between the first and the second electrodes, the first region of absorbing material configured to produce a charged particle cloud upon receiving the laser pulse, wherein the high-voltage switch is configured to generate an output current upon the charged particle cloud reaching either the first or the second electrodes and until the charged particle cloud has been collected by the first or the second electrodes, and wherein the high-voltage switch is configured to generate substantially no output current subsequent to the collection of the charged particle cloud by the first or the second electrodes and until another generated charged particle cloud reaches either the first or the second electrodes.

2. The high-voltage switch of claim 1, wherein the first region of non-absorbing material and first region of absorbing material are shaped as layers.

3. The high-voltage switch of claim 1, wherein the high-voltage switch comprises a second region of non-absorbing material, and wherein:

the first electrode is positioned at a top section of the high-voltage switch, the first region of non-absorbing material is positioned below the first electrode, the first region of absorbing material is positioned below the first region of absorbing material, the second region of non-absorbing material is positioned below the first region of absorbing material, and the second electrode is positioned below the second region of non-absorbing material such as to allow the laser pulse upon propagation through the first region of absorbing material and the second region of non-absorbing material to be reflected back to the first region of absorbing material for generation of a new charged particle cloud.

4. The high-voltage switch of claim 1, wherein:

the first electrode is positioned at a top section of the high-voltage switch, the first region of absorbing material is positioned below the first electrode, the first region of non-absorbing material is positioned below the first region of absorbing material, and the second electrode is positioned below the first region of non-absorbing material such as to allow the laser pulse upon propagation through the first region of absorbing material and the first region of non-absorbing material to be reflected back to the first region of absorbing material for generation of a new charged particle cloud.

5. The high-voltage switch of claim 1, wherein the high-voltage switch comprises a mirror, and wherein:

the first electrode is positioned at a top section of the high-voltage switch, the first region of absorbing material is positioned below the first electrode, the first region of non-absorbing material is positioned below the first region of absorbing material, the second electrode, comprising a substantially transparent material, is positioned below the first region of non-absorbing material, the substantially transparent material allowing the laser pulse to propagate therethrough without substantial absorption of the laser pulse, and the mirror is positioned below and spaced apart from the second electrode such as to allow the laser pulse upon propagation through the second electrode to be reflected back from the mirror and to the first region of absorbing material for generation of a new charged particle cloud.

6. The high-voltage switch of claim 1, wherein the first electrode comprises a plurality of conductor regions that are spaced apart and the high-voltage switch comprises a plurality of regions of non-absorbing material, and wherein:

the first electrode is positioned at a top section of the high-voltage switch, the plurality of regions of non-absorbing material, including the first region of non-absorbing material, are positioned to align with spaces between the plurality of conductor regions, the first region of absorbing material is positioned below a first conductor region of the plurality of conductor regions, and the second electrode is positioned below the first region of absorbing material.

7. The high-voltage switch of claim 1, wherein the first electrode comprises two conductor regions that are spaced apart, wherein the second electrode comprises a conductor sheet, wherein the first region of non-absorbing material and first region of absorbing material are formed as layers, and wherein:

the first electrode is positioned at a top section of the high-voltage switch, the first region of absorbing material is positioned at the top section of the high-voltage switch and in between the two conductor regions of the first electrode, the first region of non-absorbing material is positioned below the first electrode and the first region of absorbing material, and the second electrode is positioned below the first region of non-absorbing material.

8. The high-voltage switch of claim 7, wherein the first region of absorbing material is configured to enable two-photon absorption of the laser pulse.

9. The high-voltage switch of claim 1, wherein a bandgap of the non-absorbing material is higher than a bandgap of the absorbing material.

10. The high-voltage switch of claim 1, wherein a wavelength of the laser pulse is selected based on properties of the absorbing material.

11. The high-voltage switch of claim 1, wherein the absorbing material comprises vanadium-doped silicon carbide, wherein the non-absorbing material comprises undoped silicon carbide, and wherein the first electrode and the second electrode comprise a metal or a metallic alloy.

12. A high-voltage switch, comprising:

a first electrode comprising a plurality of conductor regions that are spaced apart and configured to receive a voltage having a first polarity, wherein the first electrode is positioned at a top section of the high-voltage switch;

a second electrode that is spaced apart from the first electrode and configured to receive a voltage having a second polarity or to be connected to a ground level;

at least one laser gain medium that occupies a portion of a space between the first and second electrodes, wherein the at least one laser gain medium is configured to generate a laser pulse; and a region of absorbing material occupying at least another portion of the space between the first and the second electrodes and positioned below the plurality of conductor regions of the first electrode, the region of absorbing material configured to produce a charged particle cloud upon receiving the laser pulse, wherein the second electrode is positioned below the region of absorbing material, wherein the high-voltage switch is configured to generate an output current upon the charged particle cloud reaching either the first or the second electrodes and until the charged particle cloud has been collected by the first or the second electrodes, and wherein the high-voltage switch is configured to generate substantially no output current subsequent to the collection of the charged particle cloud by the first or the second electrodes and until another generated charged particle cloud reaches either the first or the second electrodes.

13. The high-voltage switch of claim 12, wherein the region of absorbing material comprises vanadium-doped silicon carbide, and wherein the first electrode and the second electrode comprise a metal or a metallic alloy.

14. The high-voltage switch of claim 12 or 13, wherein a wavelength of the laser pulse is selected based on properties of the absorbing material.

15. An apparatus for periodic current generation comprising: a high-voltage switch, comprising "a region of absorbing material occupying at least a portion of the space between the first and the second electrodes, the first region of absorbing material configured to produce a charged particle cloud upon receiving the laser pulse, and the first and second electrodes being made of a substantially transparent material; a first laser gain medium that is spaced apart from the high-voltage switch and configured to generate a laser pulse, the first laser gain medium positioned to the left of the high-voltage switch, laser pulse propagating in a direction that is substantially perpendicular to the first region of absorbing material; a second laser gain medium that is spaced apart from the high-voltage switch, the second laser gain medium positioned to the right of the high-voltage switch and amplifying the laser pulse upon its propagation therethrough; a first reflective surface that is spaced apart from the first laser gain medium, the first reflective surface positioned to the left of the first laser gain medium and reflecting the laser pulse without substantial absorption back to the first laser gain medium; and a second reflective surface that is spaced apart from the second laser gain medium, the second reflective surface positioned to the right of the second laser gain medium and reflecting the laser pulse without substantial absorption back to the second laser gain medium and the high-voltage switch, thereby generating a new charged particle cloud.

16. The apparatus of claim 15, wherein at least one of the first and second laser gain mediums is a semiconductor laser diode.

17. The apparatus of claim 15, wherein each of the first and second reflective surfaces comprises a mirror.

18. The apparatus of claim 15, wherein each of the first and second reflective surfaces comprises a high reflectance coating deposited on a glass, metal or semiconductor substrate.

19. The apparatus of claim 15, wherein the absorbing material comprises vanadium-doped silicon carbide, and wherein the first electrode and the second electrode comprise a metal or a metallic alloy.

20. The apparatus of claim 15, wherein a wavelength of the laser pulse is based on properties of the absorbing material.

* * * * *